(12) United States Patent
Wang et al.

(10) Patent No.: US 11,385,175 B2
(45) Date of Patent: Jul. 12, 2022

(54) CALIBRATION METHOD AND TERMINAL EQUIPMENT OF TERAHERTZ FREQUENCY BAND ON-WAFER S PARAMETER

(71) Applicant: THE 13TH RESEARCH INSTITUTE OF CHINA ELECTRONICS TECHNOLOGY GROUP CORPORATION, Shijiazhuang (CN)

(72) Inventors: Yibang Wang, Shijiazhuang (CN); Aihua Wu, Shijiazhuang (CN); Faguo Liang, Shijiazhuang (CN); Chen Liu, Shijiazhuang (CN); Peng Luan, Shijiazhuang (CN); Ye Huo, Shijiazhuang (CN); Jing Sun, Shijiazhuang (CN); Yanli Li, Shijiazhuang (CN)

(73) Assignee: THE 13TH RESEARCH INSTITUTE OF CHINA ELECTRONICS TECHNOLOGY GROUP CORPORATION, Shijiazhuang (CN)

( * ) Notice: Subject to any disclaimer, the term of this patent is extended or adjusted under 35 U.S.C. 154(b) by 16 days.

(21) Appl. No.: 17/123,823

(22) Filed: Dec. 16, 2020

(65) Prior Publication Data

US 2021/0181102 A1 Jun. 17, 2021

Related U.S. Application Data

(63) Continuation of application No. PCT/CN2020/083495, filed on Apr. 7, 2020.

(30) Foreign Application Priority Data

Dec. 17, 2019 (CN) .......................... 201911302541.9

(51) Int. Cl.
*G01N 21/35* (2014.01)
*G01N 21/3586* (2014.01)
(Continued)

(52) U.S. Cl.
CPC ..... *G01N 21/3586* (2013.01); *G01N 21/3563* (2013.01); *G01N 27/026* (2013.01); *G01N 2021/3568* (2013.01)

(58) Field of Classification Search
CPC .......... G01N 21/3586; G01N 21/3563; G01N 27/026; G01N 2021/3568
See application file for complete search history.

(56) References Cited

U.S. PATENT DOCUMENTS

2004/0100276 A1 5/2004 Fanton
2008/0018343 A1* 1/2008 Hayden .................. G01D 18/00
324/601

FOREIGN PATENT DOCUMENTS

CN 103399286 A 11/2013
CN 103983931 A 8/2014
(Continued)

OTHER PUBLICATIONS

Seelmann-Eggebert et al. (On the Accurate Measurement and Calibration of S-Parameters for Millimeter Wavelengths and Beyond, IEEE Transactions on Microwave Theory and Techniques, vol. 63, No. 7, Jul. 2015) (Year: 2015).*

*Primary Examiner* — Hugh Maupin
(74) *Attorney, Agent, or Firm* — Slater Matsil, LLP (57) ABSTRACT

A calibration method includes: acquiring eight error models obtained after a preliminary calibration of a Terahertz frequency band system; based on the eight error models, determining a first mathematical model according to a first S parameter related to a first calibration piece, the first mathematical model comprising parallel crosstalk terms between probes, and determining a second mathematical model according to a second S parameter related to a second calibration piece, the second mathematical model comprising series crosstalk terms between the probes; determining a third mathematical model according to a third S parameter
(Continued)

related to a measured piece; and solving and obtaining a Z parameter of the measured piece based on the first mathematical model, the second mathematical model and the third mathematical model, and acquiring an S parameter of the measured piece according to the Z parameter of the measured piece.

13 Claims, 6 Drawing Sheets

(51) Int. Cl.
     *G01N 27/02*     (2006.01)
     *G01N 21/3563*   (2014.01)

(56) References Cited

FOREIGN PATENT DOCUMENTS

| | | | |
|---|---|---|---|
| CN | 108664717 A | 10/2018 |
| CN | 109444721 A | 3/2019 |
| CN | 110286345 A | 9/2019 |

\* cited by examiner

Fig. 1

```
┌─────────────────────────────────────────────────────────────────────────┐
│ Acquiring eight error models obtained after a preliminary calibration   │─S201
│ of a Terahertz frequency band system                                    │
└─────────────────────────────────────────────────────────────────────────┘
                                    ↓
┌─────────────────────────────────────────────────────────────────────────┐
│ Acquiring a first S parameter based on a first calibration piece on the │
│ basis of the eight error models, and determining a first mathematical   │─S202
│ model according to the first S parameter, the first mathematical model  │
│ comprising parallel crosstalk terms                                     │
└─────────────────────────────────────────────────────────────────────────┘
                                    ↓
┌─────────────────────────────────────────────────────────────────────────┐
│ Acquiring a second S parameter based on a second calibration piece on   │
│ the basis of the eight error models, and determining a second           │─S203
│ mathematical model according to the second S parameter, the second      │
│ mathematical model comprising series crosstalk terms                    │
└─────────────────────────────────────────────────────────────────────────┘
                                    ↓
┌─────────────────────────────────────────────────────────────────────────┐
│ Acquiring a third S parameter based on a measured piece on the basis of │
│ the eight error models, and determining a third mathematical model       │─S204
│ according to the third S parameter, the third mathematical model         │
│ comprising a Z parameter of the measured piece                           │
└─────────────────────────────────────────────────────────────────────────┘
                                    ↓
┌─────────────────────────────────────────────────────────────────────────┐
│ Solving and obtaining the Z parameter of the measured piece based on    │
│ the first mathematical model, the second mathematical model and the     │─S205
│ third mathematical model, and acquiring an S parameter of the measured  │
│ piece according to the Z parameter of the measured piece                │
└─────────────────────────────────────────────────────────────────────────┘
```

Fig. 16

CALIBRATION METHOD AND TERMINAL EQUIPMENT OF TERAHERTZ FREQUENCY BAND ON-WAFER S PARAMETER

CROSS-REFERENCE TO RELATED APPLICATIONS

This application is a continuation application of International Application No. PCT/CN2020/083495, filed on Apr. 7, 2020, which claims priority to Chinese Patent Application No. CN201911302541.9, filed on Dec. 17, 2019. The disclosures of the aforementioned applications are hereby incorporated herein by reference in their entireties.

TECHNICAL FIELD

The disclosure belongs to the technical field of semiconductor devices, and particularly relates to a calibration method and terminal equipment of Terahertz frequency band on-wafer S parameter.

BACKGROUND

A large number of "on-wafer S parameter test systems" deployed in the microelectronics industry require vector calibration using on-wafer calibration pieces prior to use. The types of calibration pieces include SOLT (Short-Open-Load-Thru), TRL (Thru-Reflect-Line), LRRM (Line-Reflect-Reflect-Match), etc., each corresponding to a corresponding calibration algorithm. Therefore, the main factors affecting the calibration accuracy are the calibration method and the calibration piece.

Twelve or eight error models are used in conventional calibration methods, which have high accuracy in the on-wafer filed at low frequencies (below 50 GHz), coaxial and waveguide fields. However, as the on-wafer test frequency increases, some systematic errors that can be neglected in the low frequency band are not negligible. For example, the leakage between the probes (crosstalk signal) becomes larger and larger, which affects the accuracy of the test. The error caused by the crosstalk signal to the measurement result becomes larger and larger along with the increase of the frequency. However, the conventional twelve or eight error models obviously cannot represent the crosstalk error amount, and the accuracy of the S parameter obtained by the test is low by using the conventional error model for calibration.

SUMMARY

These and other problems are generally solved or circumvented, and technical advantages are generally achieved, by embodiments of the present disclosure which provide a calibration method and terminal equipment of Terahertz frequency band on-wafer S parameter.

Technical Problems

The embodiment of the disclosure provides a calibration method and terminal equipment of Terahertz frequency band on-wafer S parameter to solve the problems that a conventional error model cannot represent the crosstalk error amount and the accuracy of the S parameter obtained by the test is low by using the conventional error model for calibration.

Technical Solutions

A first aspect of embodiments of the present disclosure provides a calibration method of Terahertz frequency band on-wafer S parameter, comprising the steps of:

acquiring eight error models obtained after a preliminary calibration of a Terahertz frequency band system;

acquiring a first S parameter based on a first calibration piece on the basis of the eight error models, and determining a first mathematical model according to the first S parameter, the first mathematical model comprising parallel crosstalk terms between probes;

acquiring a second S parameter based on a second calibration piece on the basis of the eight error models, and determining a second mathematical model according to the second S parameter, the second mathematical model comprising series crosstalk terms between the probes;

acquiring a third S parameter based on a measured piece on the basis of the eight error models, and determining a third mathematical model according to the third S parameter, the third mathematical model comprising a Z parameter of the measured piece; and solving and obtaining the Z parameter of the measured piece based on the first mathematical model, the second mathematical model and the third mathematical model, and acquiring an S parameter of the measured piece according to the Z parameter of the measured piece.

A second aspect of embodiments of the present disclosure provides a terminal equipment comprising a memory, a processor and a computer program stored in the memory and executable on the processor, where the processor, when executing the computer program, implements the steps of the calibration method of Terahertz frequency band on-wafer S parameter as described in the first aspect.

A third aspect of embodiments of the present disclosure provides a computer-readable storage medium storing a computer program which, when executed by one or more processors, implements the steps of the calibration method of Terahertz frequency band on-wafer S parameter as described in the first aspect.

Advantageous Effects of the Disclosure

The embodiments of the disclosure comprise firstly acquiring eight error models, and then respectively acquiring the first mathematical model, the second mathematical model and the third mathematical model based on the eight error models, wherein the first mathematical model comprises parallel crosstalk terms between the probes, the second mathematical model comprises series crosstalk terms between the probes, and the third mathematical model comprises the Z parameter of the measured piece; and finally solving and obtaining the Z parameter of the measured piece according to the first mathematical model, the second mathematical model and the third mathematical model, and obtaining the S parameter of the measured piece according to the Z parameter of the measured piece. The embodiments of the disclosure can realize accurate testing of Terahertz frequency band on-wafer S parameter by adding two crosstalk corrections to the eight error models.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

In order to more clearly illustrate the technical solutions in the embodiments of the present disclosure, the following description briefly introduces the drawings used in the embodiments or the prior art, and it is obvious that the drawings in the following description are only some embodiments of the present disclosure, and that other drawings can be obtained from these drawings by a person skilled in the art without involving any inventive effort.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the embodiments of this disclosure are discussed in detail below. It should be appreciated, however, that the concepts disclosed herein can be embodied in a wide variety of specific contexts. The specific embodiments discussed are merely illustrative, and do not limit the scope of the claims.

In the following description, for purposes of explanation and not limitation, specific details are set forth such as a particular system architecture, techniques, etc. in order to provide a thorough understanding of the embodiments of the present disclosure. However, it will be apparent to one skilled in the art that the present disclosure may be practiced in other embodiments without these specific details. In other instances, detailed descriptions of well-known systems, installations, circuits, and methods are omitted so as not to obscure the description of the present disclosure with unnecessary details.

In order to illustrate the technical solutions described in this disclosure, specific embodiments are described below.

Figure 1:
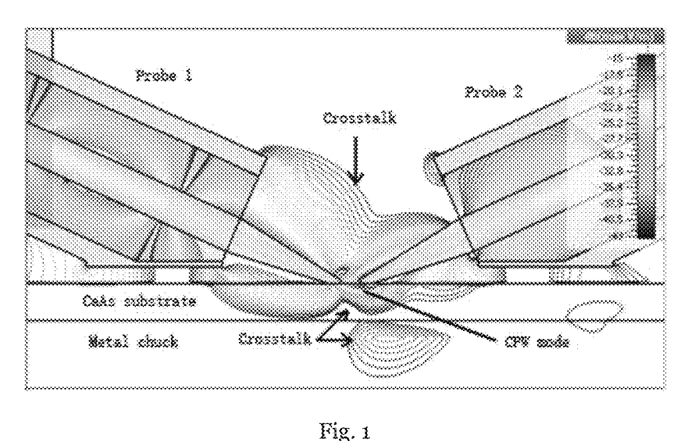
FIG. 1 is a simulation diagram of electromagnetic distribution in an on-wafer test at 110 GHz.

FIG. 1 shows a simulation diagram of electromagnetic distribution at 110 GHz in an on-wafer test. In particular, two probes at 110 GHz are used to measure the electromagnetic field distribution of a thru transmission line. The microwave probes are in an open free space and left and right probes are positioned between the air and between the substrates, respectively, creating two new energy coupling paths, collectively referred to as crosstalk signals. The measurement error caused by the crosstalk signal increases with increasing frequency. In order to measure the S parameter accurately, a calibration method of Terahertz frequency band on-wafer S parameter is provided. The S parameter is a scattering parameter.

Figure 2:
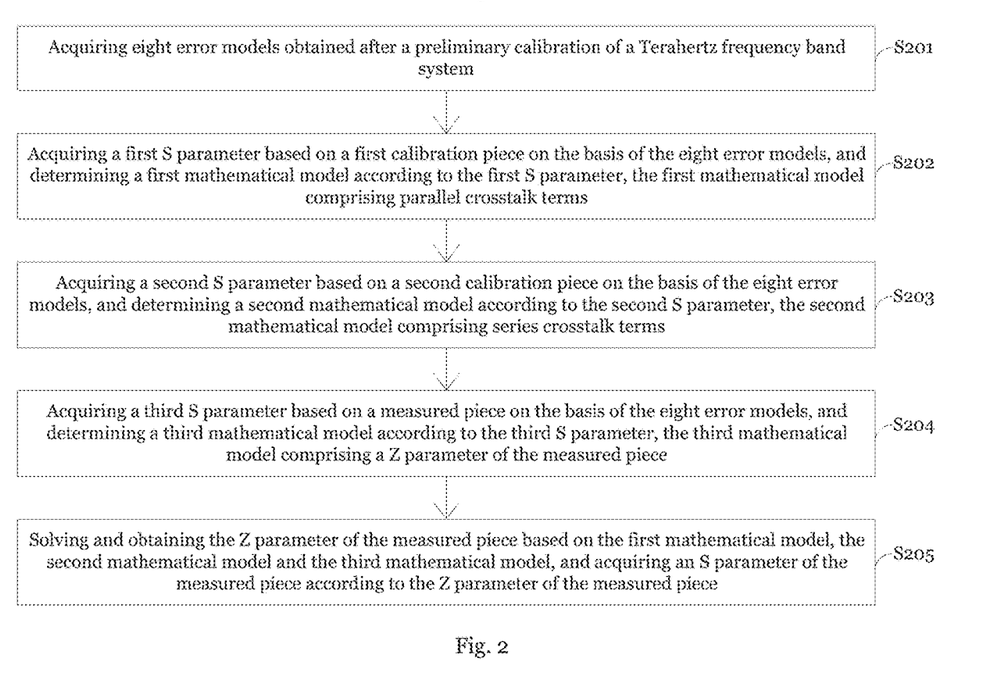
FIG. 2 is a flow diagram illustrating an implementation of a calibration method of Terahertz frequency band on-wafer S parameter according to an embodiment of the present disclosure.

FIG. 2 is a flow diagram illustrating an implementation of a calibration method of Terahertz frequency band on-wafer S parameter provided in an embodiment of the present disclosure. For ease of illustration, only those portions relevant to embodiments of the present disclosure are shown and described in detail below. The executive body of the embodiment of the disclosure can be terminal equipment.

As shown in FIG. 2, the calibration method of Terahertz frequency band on-wafer S parameter comprises the following steps.

S201: acquire eight error models obtained after a preliminary calibration of a Terahertz frequency band system.

Specifically, the Multiline TRL calibration method can be adopted to obtain the eight error models. The calibration can be carried out at the coaxial or waveguide outlet of the system firstly, then the S parameters of the probes are measured, and the eight error models are obtained by cascade calculation.

The Terahertz frequency band system can be an on-wafer S parameter test system of the Terahertz frequency band. For example, it may be a Terahertz band on-wafer vector network analyzer.

S202: acquire a first S parameter based on a first calibration piece on the basis of the eight error models, and determine a first mathematical model according to the first S parameter, the first mathematical model comprising parallel crosstalk terms between probes.

In the embodiment of the disclosure, the Terahertz frequency band system is preliminarily calibrated by the eight error models to obtain the Terahertz frequency band system after a preliminary calibration. Then the measured piece is replaced by the first calibration piece, namely the first calibration piece is placed at the position of the measured piece; the S parameter of the first calibration piece is measured by adopting the Terahertz frequency band system after the preliminary calibration to obtain the first S parameter; and the first mathematical model containing the parallel crosstalk terms between the probes is established according to the first S parameter. Here, the first calibration piece may be an Open-Open calibration piece.

In an embodiment of the present disclosure, the step S202 comprises the steps of:

Generating a first equivalent circuit model corresponding to the first calibration piece based on the first calibration piece;

Acquiring the first S parameter of the first calibration piece obtained by measurement according to the eight error models;

Converting the first S parameter into a first Y parameter; and

Determining a first mathematical model according to the first Y parameter and the first equivalent circuit model.

In an embodiment of the present disclosure, the first mathematical model is $$Y_{Total}^{OPN} = Y_{PAD} + Y_P \quad (1)$$

where $Y_{total}^{OPN}$ is the first Y parameter, $Y_{PAD}$ is a PAD (or pad) parallel parasitic parameter, and $Y_P$ is the parallel crosstalk terms between the probes.

The Y parameter is an admittance parameter. The Y parameter and the S parameter can be interconverted by existing methods, and the Y parameter and the S parameter are 2*2 matrices.

Figure 3:
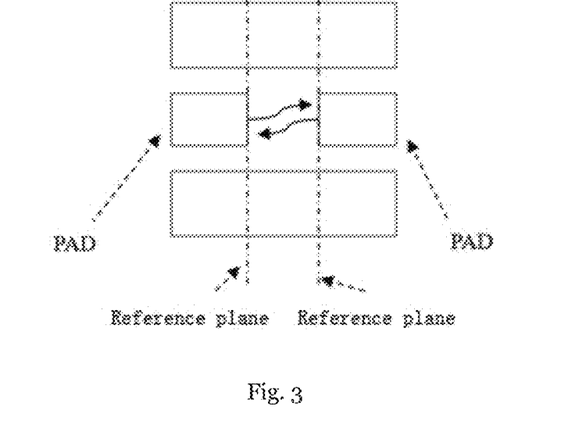
FIG. 3 is a schematic diagram of a test reference surface based on a first calibration piece according to an embodiment of the present disclosure.

FIG. 3 shows a schematic diagram of a test reference plane based on the first calibration piece, i.e. a schematic diagram of an ideal open test reference plane. In the figure, the PAD is used to connect the measured piece to the probe. In FIG. 3, the first calibration piece replaces the measured piece, so that the PAD is used to connect the first calibration piece to the probe in FIG. 3.

Figure 4:
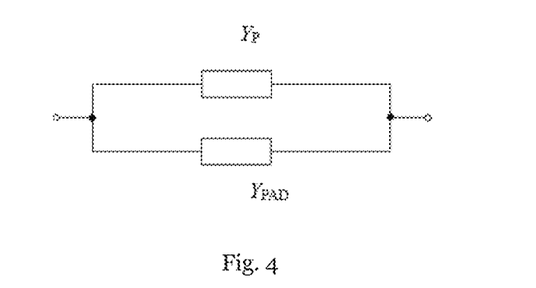
FIG. 4 is a schematic diagram of a first equivalent circuit model according to an embodiment of the present disclosure.

FIG. 4 shows a schematic diagram of the first equivalent circuit model corresponding to the first calibration piece. Referring to FIG. 4, in the first equivalent circuit model, $Y_{PAD}$ is connected in parallel with $Y_P$, and the first mathematical model as shown in formula (1) can be determined based on the first equivalent circuit model. Each parameter in the first mathematical model is a 2*2 matrix.

Figure 5:
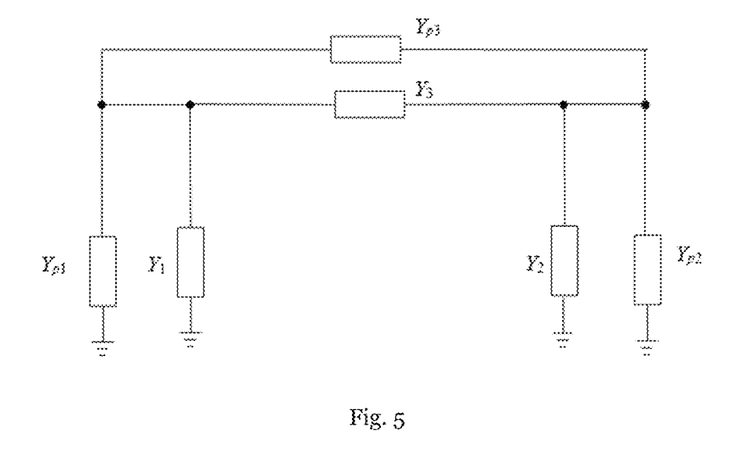
FIG. 5 is a schematic diagram of another first equivalent circuit model according to an embodiment of the present disclosure.

$Y_{PAD}$ is a π type two-port network circuit, see FIG. 5, and $$Y_{PAD} = \begin{bmatrix} Y_1 + Y_3 & -Y_3 \\ -Y_3 & Y_2 + Y_3 \end{bmatrix},$$

$Y_1$, $Y_2$ and $Y_3$ are elements in the $Y_{PAD}$ matrix, respectively. $Y_P$ is a π type two-port network circuit, see FIG. 5, and $$Y_P = \begin{bmatrix} Y_{p1} + Y_{p3} & -Y_{p3} \\ -Y_{p3} & Y_{p2} + Y_{p3} \end{bmatrix},$$

$Y_{p1}$, $Y_{p2}$, and $Y_{p3}$ are elements in the $Y_P$ matrix, respectively.

In the embodiment of the disclosure, firstly, the first S parameter $S_{Total}^{OPN}$ of the first calibration piece is measured by using the Terahertz frequency band system after preliminary calibration, where the first S parameter $S_{Total}^{OPN}$ a comprises crosstalk and an ideal open circuit; then the first S parameter is converted into the first Y parameter $Y_{Total}^{OPN}$ by adopting an existing method; and finally the first mathematical model is determined to be the formula (1) according to the first equivalent circuit model and the first Y parameter $Y_{Total}^{OPN}$.

S203: acquire a second S parameter based on a second calibration piece on the basis of the eight error models, and determine a second mathematical model according to the second S parameter, the second mathematical model comprising series crosstalk terms between the probes.

The measured piece is replaced by the second calibration piece, namely the second calibration piece is placed at the position of the measured piece; the S parameter of the second calibration piece is measured by adopting the Terahertz frequency band system after the preliminary calibration to obtain the second S parameter; and the second mathematical model containing series crosstalk terms between the probes is established according to the second S parameter. Here, the second calibration piece may be a Short-Short calibration piece.

In an embodiment of the present disclosure, the step S203 comprises the steps of:

generating a second equivalent circuit model corresponding to the second calibration piece based on the second calibration piece;

acquiring the second S parameter of the second calibration piece obtained by measurement according to the eight error models;

converting the second S parameter into a second Y parameter; and determining the second mathematical model according to the second Y parameter and the second equivalent circuit model.

In an embodiment of the disclosure, the second mathematical model is $$Y_{Total}^{SHORT} = Y_{PAD} + Y_P + (Z_S + Z_L)^{-1} \quad (2)$$

where $Y_{Total}^{SHORT}$ is the second Y parameter, $Y_{PAD}$ is a PAD parallel parasitic parameter, $Y_P$ is the parallel crosstalk terms between the probes, $Z_S$ is the series crosstalk terms between the probes, and $Z_L$ is a series parasitic parameter (short-circuit parasitic parameter) of a PAD intraconnection.

The Z parameter is an impedance parameter. The Z parameter, the Y parameter, and the S parameter may be interconverted by existing methods.

Figure 6:
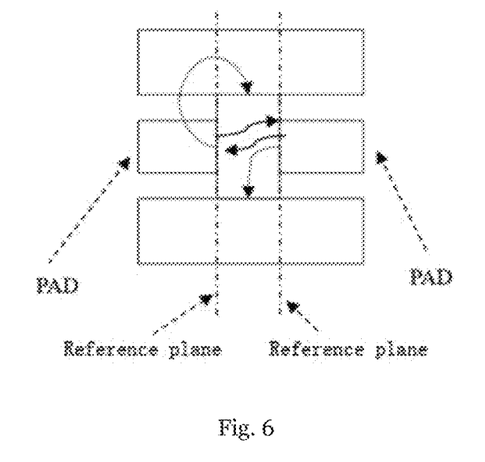
FIG. 6 is a schematic diagram of a test reference surface based on a second calibration piece according to an embodiment of the present disclosure.

FIG. 6 shows a schematic diagram of a test reference plane based on the second calibration piece, i.e. a schematic diagram of an ideal short-circuit test reference plane. In FIG. 6, the second calibration piece replaces the measured piece, so the PAD in FIG. 6 is used to connect the second calibration piece to the probe.

Figure 7:
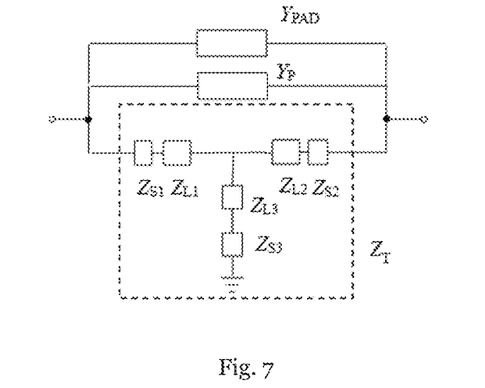
FIG. 7 is a schematic diagram of a second equivalent circuit model according to an embodiment of the present disclosure.

FIG. 7 shows a schematic diagram of the second equivalent circuit model corresponding to the second calibration piece. As seen in FIG. 7, in the second equivalent circuit model, $Y_{PAD}$ is connected in parallel with $Y_P$, which is connected in parallel with the portion in a dashed box, the interior of the dashed box is denoted as $Z_T$, which is converted into a corresponding Y parameter $(Z_T)^{-1}$. $Z_T$ is an intermediate parameter containing the series parasitic parameter and the series crosstalk term, $Z_T=Z_S+Z_L$, both $Z_S$ and $Z_L$ are T type two-port network circuits, $$Z_S = \begin{bmatrix} Z_{S1}+Z_{S3} & Z_{S3} \\ Z_{S3} & Z_{S2}+Z_{S3} \end{bmatrix}, Z_L = \begin{bmatrix} Z_{L1}+Z_{L3} & Z_{L3} \\ Z_{L3} & Z_{L2}+Z_{L3} \end{bmatrix},$$

$Z_{S1}$, $Z_{S2}$ and $Z_{S3}$ are elements in $Z_S$ matrix, respectively, and $Z_{L1}$, $Z_{L2}$ and $Z_{L3}$ are elements in the $Z_L$ matrix, respectively.

The second mathematical model can be determined based on the second equivalent circuit model, as shown in the formula (2). Each parameter in formula (2) is a 2*2 matrix.

In the embodiment of the disclosure, the second S parameter $S_{Total}^{SHORT}$ of the second calibration piece is measured by using the Terahertz frequency band system after a preliminary calibration, where the second S parameter $S_{Total}^{SHORT}$ comprises crosstalk and parasitic parameters; then the second S parameter $S_{Total}^{SHORT}$ is converted into the second Y parameter $Y_{Total}^{SHORT}$ by adopting an existing method; and finally the second mathematical model is determined to be the formula (2) according to the second equivalent circuit model and the second Y parameter $Y_{Total}^{SHORT}$.

S204: acquire a third S parameter based on a measured piece on the basis of the eight error models, and determine a third mathematical model according to the third S parameter, the third mathematical model comprising a Z parameter of the measured piece.

The S parameter of the measured piece is measured by adopting the Terahertz frequency band system after the preliminary calibration to obtain the third S parameter; and the third mathematical model containing the Z parameter of the measured piece is established according to the third S parameter.

In an embodiment of the present disclosure, the step S204 comprises the steps of:

generating a third equivalent circuit model corresponding to the measured piece based on the measured piece;

acquiring the third S parameter of the measured piece obtained by measurement according to the eight error models;

converting the third S parameter into a third Y parameter; and determining the third mathematical model according to the third Y parameter and the third equivalent circuit model.

In an embodiment of the present disclosure, the third mathematical model is $$Y_{Total}^{DUT}=Y_P+Y_{PAD}+(Z_S+Z_L+Z_{DUT})^{-1} \quad (3)$$

where $Y_{Total}^{DUT}$ is the third Y parameter, $Y_P$ is the parallel crosstalk terms between the probes, $Y_{PAD}$ is a PAD parallel parasitic parameter, $Z_S$ is the series crosstalk terms between the probes, $Z_L$ is a series parasitic parameter of a PAD intraconnection, and $Z_{DUT}$ is the Z parameter of the measured piece.

Figure 8:
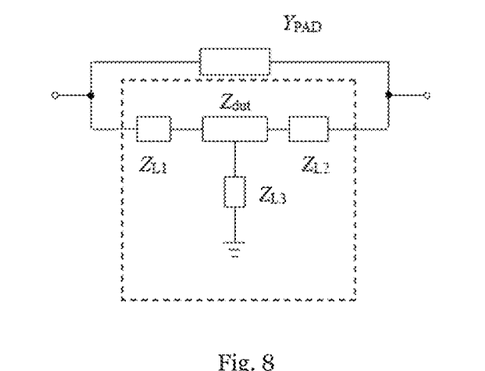
FIG. 8 is a schematic diagram of an equivalent circuit model with a measured piece and a probe connected by a PAD (or pad) according to an embodiment of the present disclosure.

FIG. 8 shows a schematic diagram of an equivalent circuit model with a measured piece DUT and a probe connected by a PAD, i.e., a schematic diagram of a PAD parasitic equivalent circuit model. $Y_{PAD}$ is a π type two-port network circuit, see FIG. 9, and $$Y_{PAD} = \begin{bmatrix} Y_1+Y_3 & -Y_3 \\ -Y_3 & Y_2+Y_3 \end{bmatrix},$$

Figure 9:
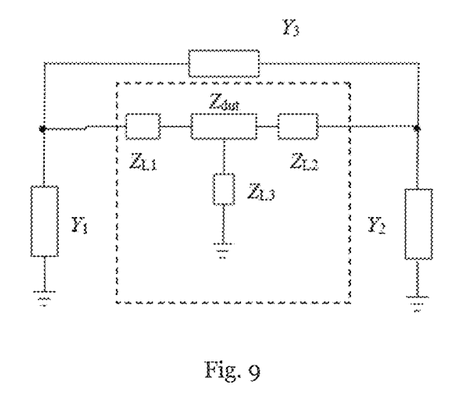
FIG. 9 is a schematic diagram of another equivalent circuit model of the measured piece connected with the probe by the PAD according to an embodiment of the present disclosure.

$Y_1$, $Y_2$ and $Y_3$ are elements in the $Y_{PAD}$ matrix, respectively.

Figure 10:
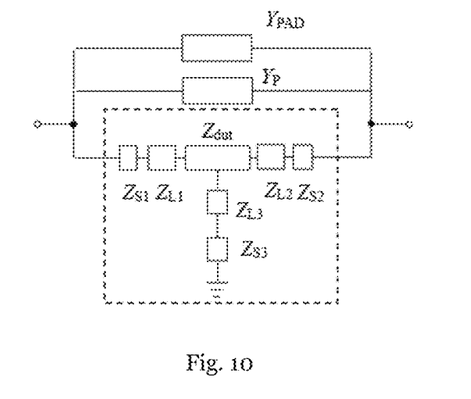
FIG. 10 is a schematic diagram of a third equivalent circuit model according to an embodiment of the present disclosure.

FIG. 1 shows a schematic diagram of the third equivalent circuit model, which is an error model including PAD parasitic and crosstalk. Referring to FIG. 10, in the third equivalent circuit model, $Y_{PAD}$ is connected in parallel with Ye, which is connected in parallel with the portion in the dashed box, the interior of the dashed box is denoted as $Z_T+Z_{DUT}$, which is converted to the corresponding Y parameter $(Z_T+Z_{DUT})^{-1}$, i.e., $(Z_S+Z_L+Z_{DUT})^{-1}$. The third mathematical model can be determined based on the third equivalent circuit model as shown in the formula (3). Each parameter in the third mathematical model is a 2*2 matrix.

Figure 11:
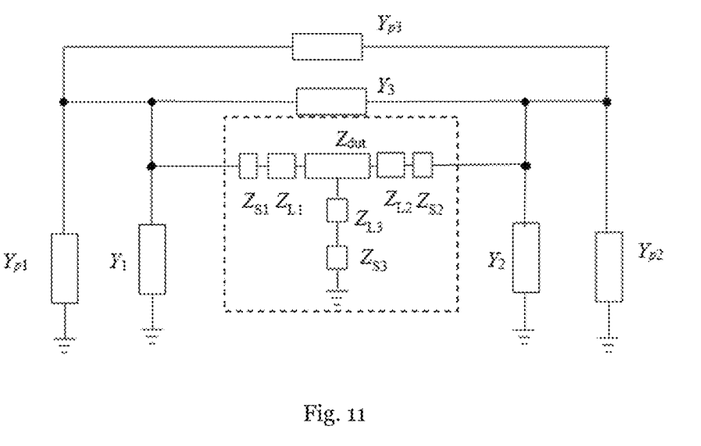
FIG. 11 is a schematic diagram of another third equivalent circuit model according to an embodiment of the present disclosure.

$Y_P$ is a π type two-port network circuit, see FIG. 11, and $$Y_P = \begin{bmatrix} Y_{p1}+Y_{p3} & -Y_{p3} \\ -Y_{p3} & Y_{p2}+Y_{p3} \end{bmatrix},$$

$Y_{p1}$, $Y_{p2}$ and $Y_{p3}$ are elements in the $Y_P$ matrix, respectively.

The electromagnetic field distribution of the Terahertz frequency band test is analyzed, see FIG. 1, a leakage path exists between the probes. Similarly, the leakage path also exists between the probe and the ground. Based on this, the third equivalent circuit model is established.

In the embodiment of the disclosure, firstly, the third S parameter $S_{Total}^{DUT}$ of the measured piece is measured by using the Terahertz frequency band system after the preliminary calibration; then the third S parameter $S_{Total}^{DUT}$ is converted into the third Y parameter $Y_{Total}^{DUT}$ by adopting an existing method; and finally the third mathematical model is determined to be the formula (3) according to the third equivalent circuit model and the third Y parameter $Y_{Total}^{DUT}$.

S205: solve and obtain the Z parameter of the measured piece based on the first mathematical model, the second mathematical model and the third mathematical model, and acquire an S parameter of the measured piece according to the Z parameter of the measured piece.

Specifically, the following formula (4) can be obtained by subtracting the formula (1) from the formula (2):

$$(Z_S+Z_L)^{-1}Y_{Total}^{SHORT}-Y_{Total}^{OPN} \quad (4)$$

The following formula (5) can be obtain by subtracting the formula (1) from the formula (3):

$$(Z_S+Z_L+Z_{DUT})^{-1}Y_{Total}^{DUT}-Y_{Total}^{OPN} \quad (5)$$

$Z_S+Z_L$ may be obtained by the formula (4), $Z_S+Z_L+Z_{DUT}$ can be obtained by the formula (5), and $Z_{DUT}$ can be obtained by the formula (6), i.e. the Z parameter of the measured piece is obtained. By means of the existing method, the Z parameter of the measured piece can be converted into the S parameter of the measured piece, where the S parameter of the measured piece is the S parameter of the calibrated measured piece.

$$Z_{DUT}=Z_S+Z_L+Z_{DUT}-(Z_S+Z_L) \quad (6)$$

In an embodiment of the present disclosure, the first calibration piece is an Open-Open calibration piece, and the second calibration piece is a Short-Short calibration piece.

Alternatively, orthogonal autoregressive algorithm can be used to reduce random errors and improve test accuracy.

It can be seen from the above description that two times of crosstalk correction are added to the eight error models in the embodiment of the present disclosure. Therefore, the accurate test of Terahertz frequency band on-wafer S parameter can be realized, the accuracy of the S parameter is improved, and the connection structure and the crosstalk error of the measured piece can be eliminated at the same time, achieving a better index, and meeting the commercial on-wafer S parameter calibration work on the market.

In particular, by conventional calibration and test of the Open-Open and Short-Short calibration pieces, the problem of de-embedding the connection structure PAD of the measured piece in the Terahertz test can be solved, the crosstalk (leakage) between microwave probes can be eliminated, and the effective test end face is extended to the root of the die. The solving method is given by establishing the connection structure PAD of the measured piece and the error model between the crosstalk and the measured piece. The conventional calibration method is adopted to carry out primary calibration, data of a measured piece, Open-Open and Short-Short are obtained by the test, data of the root of the measured piece for eliminating high-frequency crosstalk are ultimately obtained by the established error model, and finally the test accuracy of on-wafer S parameter can be improved.

Figure 12:
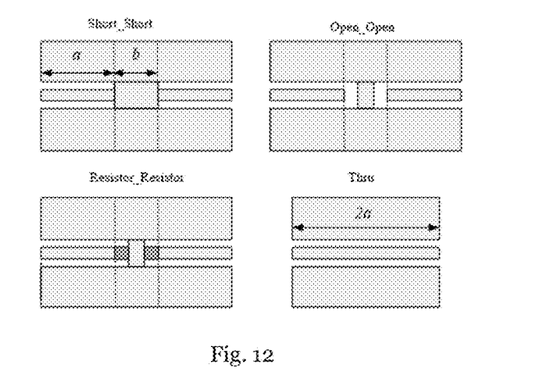
FIG. 12 is a schematic diagram of various calibration pieces according to an embodiment of the present disclosure.

In order to verify the above methods, 3 mm frequency band and 140 GHz-220 GHz calibration pieces and crosstalk verification pieces are developed. The schematic diagram of some calibration pieces is shown in FIG. 12. The calibration pieces are divided into a Multiline TRL calibration piece and a crosstalk calibration piece. A Coplanar Waveguide (CPW) transmission line with a thru length of 400 μm is designed in the Multiline TRL calibration piece with the remaining extra lengths of 100 m, 300 μm, 500 μm, 2000 μm, 5000 μm, 7000 μm, 11000 μm and the reflection standard of Short-Short; and the two port standards are Open-Open, Short-Short, Resistor-Resistor (for definition of the Multiline TRL calibration piece), and the single port offset is half of Thru, 200 μm. The measured piece is a passive attenuator, left and right ports are connected in series at 50 ohms, and upper and lower floors are connected in parallel at 75 ohms, so that the attenuator structure is most sensitive to crosstalk. In FIG. 12, a=200 μm, and b=220 μm.

Firstly, a basic on-wafer vector network analyzer is calibrated by adopting the multiline TRL calibration method to obtain an 8 error models, and then a measurement is performed to obtain a measurement result of a passive attenuator which is not corrected by crosstalk. Secondly, two crosstalk calibration pieces are measured by using the calibrated on-wafer vector network analyzer to obtain ideal Open-Open and Short-Short. Finally, a measurement result corrected by the crosstalk of the passive attenuator is obtained according to the measurement model. After the measurement is finished, the passive attenuator needs to be subjected to electromagnetic field simulation to obtain S parameters of the passive attenuator, and measurement results and simulation results before and after crosstalk correction are compared.

The passive attenuator is measured by the on-wafer vector network analyzer to obtain the S parameter without crosstalk correction, and the S parameter of the final measured piece is obtained according to the formulas (4), (5) and (6), namely the calibrated S parameter. The measurement results are shown in FIGS. 13 and 14.

Figure 13:
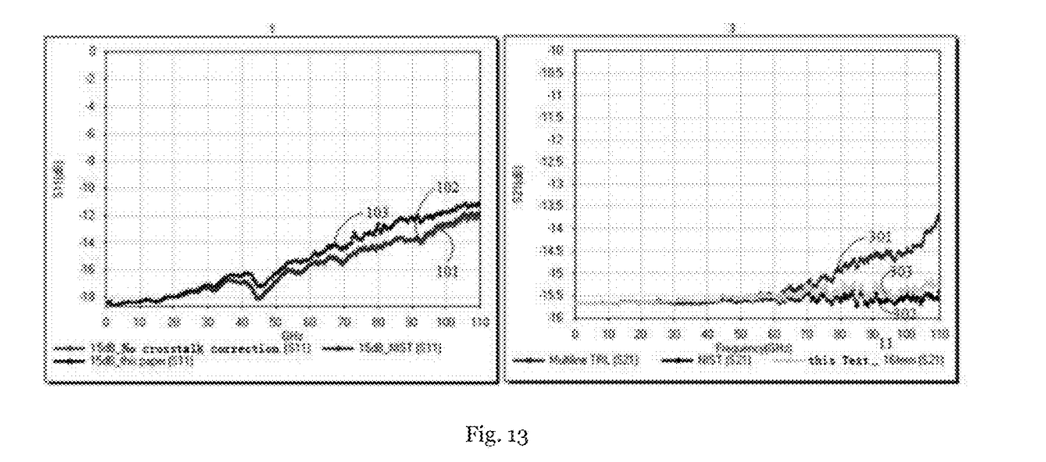
FIG. 13 shows verification results from a 0.2 GHz-110 GHz model according to an embodiment of the present disclosure.

In FIG. 13, and in the graph on the left, 15 dB represents a measured piece. "15 dB_no crosstalk correction (S11)" is a measurement result of S11 with no crosstalk correction, corresponding to a curve 101 in the figure. "15 dB_this paper (S11)" is a measurement result of S11 by the calibration method provided in the embodiment of the present disclosure, corresponding to a curve 103 in the figure. "15 dB_NIST (S11)" is a measurement result of S11 for NIST, corresponding to a curve 102 in the figure. In the graph on the right, "Multiline TRL (S 21)" is a measurement result of S21 with no crosstalk correction, corresponding to a curve 301 in the figure. "NIST (S21)" is a measurement result of S21 with NIST crosstalk correction, corresponding to a curve 302 in the figure. "This paper_16term (S21)" is a measurement result of S21 by the calibration method provided in the embodiments of the present disclosure, corresponding to a curve 303 in the figure. S21 is improved by more than 1.3 dB, which is more consistent with the trend of simulation value.

Figure 14:
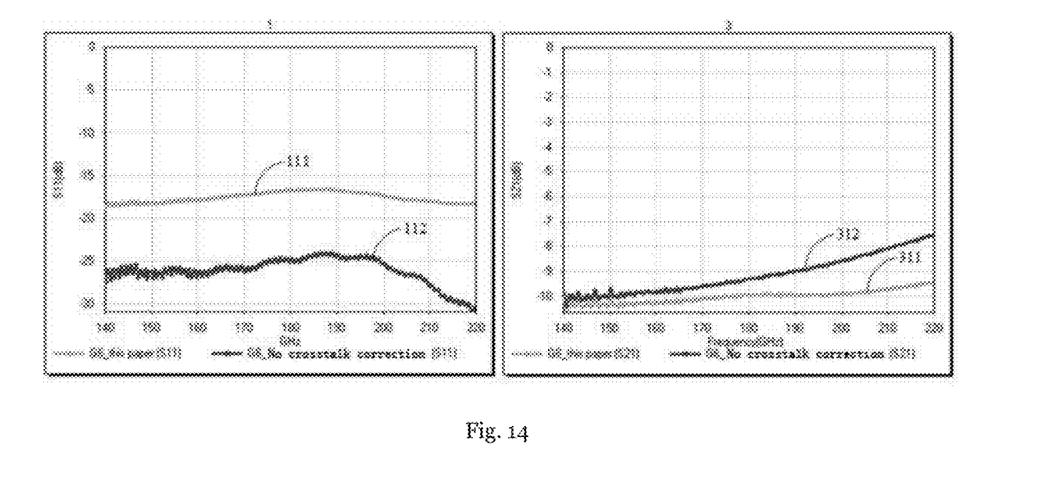
FIG. 14 shows verification results from a 140 GHz-220 GHz model according to an embodiment of the present disclosure.

In FIG. 14, G6 represents a measured piece. In the graph on the left, "G6_no crosstalk correction (S11)" is a measurement result of S11 with no crosstalk correction, corresponding to a curve 112 in the figure. "G6_this paper (S11)" is a measurement result of S11 by the calibration method provided in the embodiment of the present disclosure, corresponding to a curve 111 in the figure. In the graph on the right, "G6_no crosstalk correction (S21)" is a measurement result of S21 with no crosstalk correction, corresponding to a curve 312 in the figure. "G6_this paper (S21)" is a measurement result of S21 by the calibration method provided in the embodiment of the present disclosure, corresponding to a curve 311 in the figure. It can be seen that S21 is improved by 1.5 dB or more, which is more consistent with the trend of simulation values.

It should be understood that the sequence numbers of the steps in the above-described embodiments are not meant to imply a sequential order of execution, and that the order of execution of the processes should be determined by their function and inherent logic, and should not be construed as limiting the implementation of the embodiments of the present disclosure in anyway.

Figure 15:
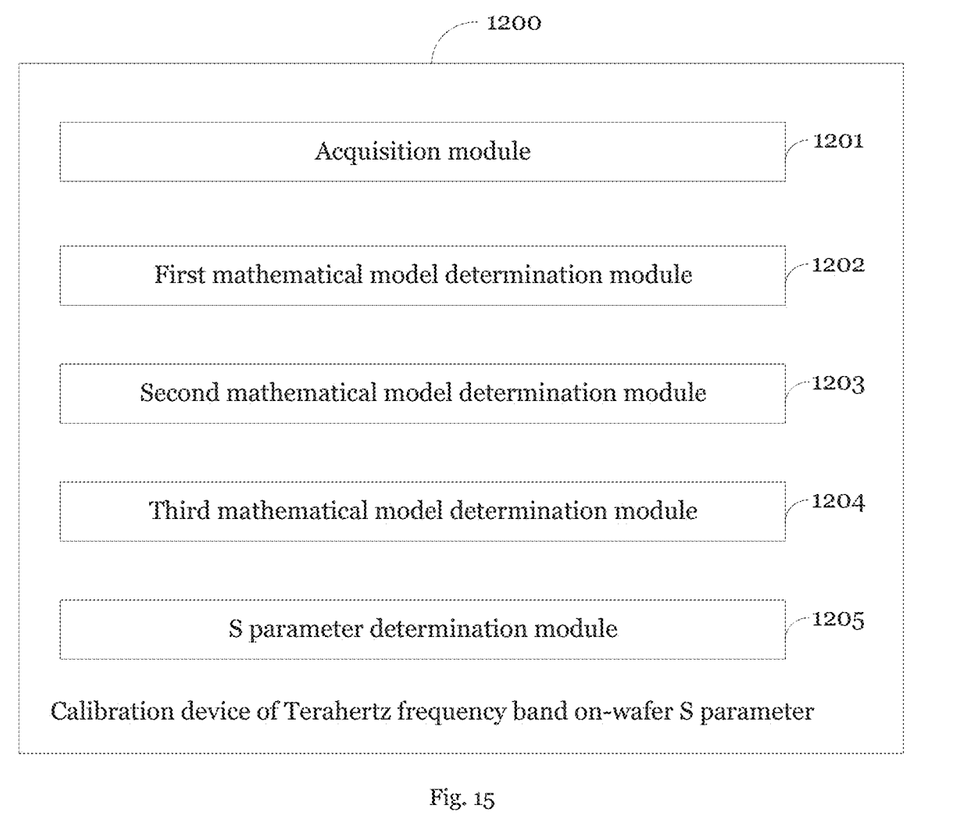
FIG. 15 is a structure diagram illustrating a calibration device of Terahertz frequency band on-wafer S parameter according to an embodiment of the present disclosure.

FIG. 15 is a schematic block diagram illustrating an implementation of a calibration device of Terahertz frequency band on-wafer S parameter provided in an embodiment of the present disclosure. For ease of illustration, only those portions relevant to embodiments of the present disclosure are shown and described in detail below.

In the embodiment of the disclosure, the calibration device 1200 of Terahertz frequency band on-wafer S parameter can comprise an acquisition module 1201, a first mathematical model determination module 1202, a second mathematical model determination module 1203, a third mathematical model determination module 1204, and an S parameter determination module 1205.

The acquisition module 1201 is configured for acquiring eight error models obtained after a preliminary calibration of a Terahertz frequency band system.

The first mathematical model determination module 1202 is configured for acquiring a first S parameter based on a first calibration piece on the basis of the eight error models, and determining a first mathematical model according to the first S parameter, the first mathematical model comprising parallel crosstalk terms between probes.

The second mathematical model determination module 1203 is configured for acquiring a second S parameter based on a second calibration piece on the basis of the eight error models, and determining a second mathematical model according to the second S parameter, the second mathematical model comprising series crosstalk terms between the probes.

The third mathematical model determination module 1204 is configured for acquiring a third S parameter based on a measured piece on the basis of the eight error models, and determining a third mathematical model according to the third S parameter, the third mathematical model comprising a Z parameter of the measured piece.

The S parameter determination module 1205 is configured for solving and obtaining a Z parameter of the measured piece based on the first mathematical model, the second mathematical model and the third mathematical model, and acquiring an S parameter of the measured piece according to the Z parameter of the measured piece.

Optionally, the first mathematical model determination module 1202 is specifically configured for:

generating a first equivalent circuit model corresponding to the first calibration piece based on the first calibration piece;

acquiring a first S parameter of the first calibration piece obtained by measurement according to the eight error models;

converting the first S parameter into a first Y parameter; and determining a first mathematical model according to the first Y parameter and the first equivalent circuit model.

Alternatively, the first mathematical model is $Y_{Total}^{OPN}=Y_{PAD}+Y_P$, where $Y_{Total}^{OPN}$ is the first Y parameter, $Y_{PAD}$ is a PAD parallel parasitic parameter, and $Y_P$ is the parallel crosstalk terms between the probes.

Alternatively, the second mathematical model determination module 1203 is specifically configured for:

generating a second equivalent circuit model corresponding to the second calibration piece based on the second calibration piece;

acquiring a second S parameter of the second calibration piece obtained by measurement according to the eight error models;

converting the second S parameter into a second Y parameter; and determining a second mathematical model according to the second Y parameter and the second equivalent circuit model.

Alternatively, the second mathematical model is $Y_{Total}^{SHORT}=Y_{PAD}+Y_P+(Z_X+Z_L)^{-1}$, where $Y_{Total}^{SHORT}$ is the second Y parameter, $Y_{PAD}$ is a PAD parallel parasitic parameter, $Y_P$ is the parallel crosstalk terms between the probes, $Z_S$ is the series crosstalk terms between the probes, and $Z_L$ is a series parasitic parameter of a PAD intraconnection.

Optionally, the third mathematical model determination module 1204 is specifically configured for:

generating a third equivalent circuit model corresponding to the measured piece based on the measured piece;

acquiring a third S parameter of the measured piece obtained by measurement according to the eight error models;

converting the third S parameter into a third Y parameter; and determining a third mathematical model according to the third Y parameter and the third equivalent circuit model.

Alternatively, the third mathematical model is $Y_{Total}^{DUT}=Y_P+Y_{PAD}+(Z_S+Z_L+Z_{DUT})^{-1}$, where $Y_{Total}^{DUT}$ is the third Y parameter, $Y_P$ is a parallel crosstalk terms between the probes, $Y_{PAD}$ is a PAD parallel parasitic parameter, $Z_S$ is the series crosstalk terms between the probes, $Z_L$ is the series parasitic parameter of a PAD intraconnection, and $Z_{DUT}$ is the Z parameter of the measured piece.

Alternatively, the first calibration piece is an Open-Open calibration piece, and the second calibration piece is a Short-Short calibration piece.

It can be clearly understood by a person skilled in the art that, for convenience and conciseness of description, only the division of the above-mentioned functional elements and modules is exemplified. In practical applications, the above-mentioned distribution of functions can be completed by different functional elements and modules according to requirements, i.e. the internal structure of calibration device of Terahertz frequency band on-wafer S parameter is divided into different functional elements or modules so as to complete all or part of the functions described above. The functional elements and modules in the embodiments may be integrated in one processing unit, may be physically separate from each other, or may be integrated in one unit by two or more units. The integrated units may be either in the form of hardware or in the form of software functional units. In addition, the specific names of the functional elements and modules are merely for convenience of mutual distinction, and are not used to limit the scope of protection of the present disclosure. The specific working process of the elements and modules can refer to the corresponding process in method embodiment 1, which is not described in detail herein.

Figure 16:
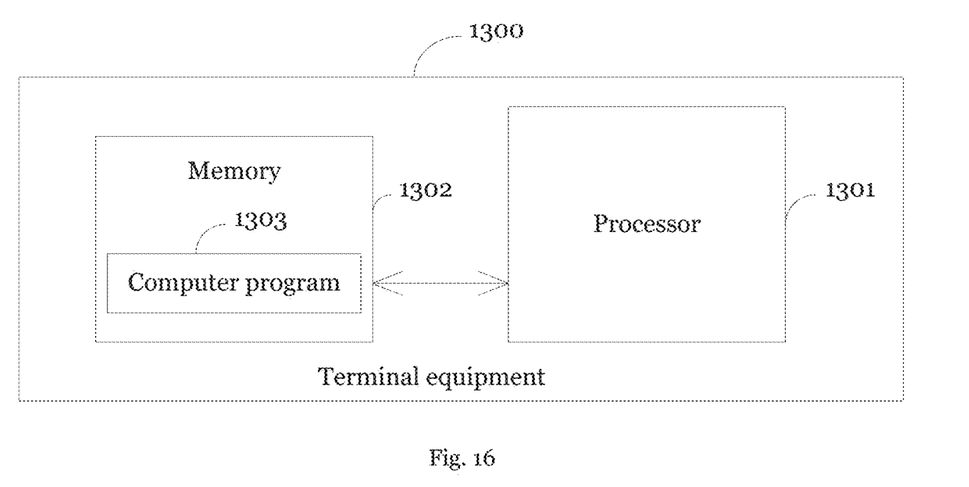
FIG. 16 is a structure diagram of the terminal equipment according to an embodiment of the present disclosure.

FIG. 16 is a schematic block diagram of terminal equipment provided in an embodiment of the present application. As shown in FIG. 16, the terminal equipment 1300 of this embodiment comprises one or more processors 1301, a memory 1302, and a computer program 1303 stored in the memory 1302 and executable on the processor 1301. The processor 1301, when executing the computer program 1303, implements the steps in the embodiments of the calibration method of Terahertz frequency band on-wafer S parameter, e.g. steps S201 to S205 shown in FIG. 2. Alternatively, the processor 1301, when executing the computer program 1303, performs functions of each modules/units in the embodiments of the calibration device of Terahertz frequency band on-wafer S parameter, such as the functions of the modules 1201 to 1205 shown in FIG. 15.

Illustratively, the computer program 1303 may be partitioned into one or more modules/units that are stored in the memory 1302 and executed by the processor 1301 to complete the present disclosure. The one or more modules/units may be a series of computer program instruction segments capable of performing specific functions for describing the executive process of the computer program 1303 in the terminal equipment 1300. For example, the computer program 1303 may be partitioned into an acquisition module, a first mathematical model determination module, a second mathematical model determination module, a third mathematical model determination module, and an S parameter determination module, each having the following specific functions.

The acquisition module is used for acquiring eight error models obtained after a preliminary calibration of a Terahertz frequency band system.

The first mathematical model determination module is configured for acquiring a first S parameter based on a first calibration piece on the basis of the eight error models, and determining a first mathematical model according to the first S parameter, the first mathematical model comprising parallel crosstalk terms between probes.

The second mathematical model determination module is configured for acquiring a second S parameter based on a second calibration piece on the basis of the eight error models, and determining a second mathematical model according to the second S parameter, the second mathematical model comprising series crosstalk terms between the probes.

The third mathematical model determining module is configured for acquiring a third S parameter based on a measured piece on the basis of the eight error models, and determining a third mathematical model according to the third S parameter, the third mathematical model comprising a Z parameter of the measured piece.

The S parameter determination module is configured for solving and obtaining a Z parameter of the measured piece based on the first mathematical model, the second mathematical model and the third mathematical model, and acquiring an S parameter of the measured piece according to the Z parameter of the measured piece.

Other modules or units may be described with reference to the embodiment shown in FIG. 15 and will not be described in detail herein.

The terminal equipment 1300 may be a computing device such as a desktop computer, a notebook, a palmtop computer, or a cloud server, and may also be a DSP (digital signal processor). The terminal equipment includes, but is not limited to, a processor 1301, and a memory 1302. Those skilled in the art will appreciate that FIG. 16 is merely an example of terminal equipment 1300 and is not to be construed as limiting the terminal equipment 1300, and may include more or fewer components than shown, or may combine certain components, or different components, e.g., the terminal equipment 1300 may also include input and output devices, a network access device, a bus, etc.

The processor 1301 may be a central processing unit (CPU) or other general purpose processor, a Digital Signal Processor (DSP), an Application Specific Integrated Circuit (ASIC), Field-Programmable Gate Array (FPGA) or other programmable logic devices, discrete gate or transistor logic devices, discrete hardware components, etc. A general purpose processor may be a microprocessor or the processor may be any conventional processor or the like.

The memory 1302 may be an internal storage unit of the terminal equipment 1300, such as a hard disk or a memory of the terminal equipment 1300. The memory 1302 may also be an external storage device of the terminal equipment 1300, such as a plug-in hard disk, a Smart Media Card (SMC), a Secure Digital (SD) card, a Flash Card, etc. provided on the terminal equipment 1300. Further, the memory 1302 may also comprise both an internal storage unit and an external storage device of the terminal equipment 1300. The memory 1302 is used for storing the computer program 1303, and other programs and data required by the terminal equipment 1300. The memory 1302 may also be used to temporarily store data that has been or will be output.

In the embodiments described above, emphasis has been placed on the description of various embodiments. Parts of an embodiment that are not described or illustrated in detail may be found in the description of other embodiments.

Those of ordinary skill in the art will recognize that the elements and algorithm steps described in connection with the embodiments disclosed herein may be implemented by an electronic hardware, or a combination of computer software and electronic hardware. Whether such functions are implemented by hardware or software depends upon the particular application and design constraints of the technical solutions. Skilled artisans may implement the described functions in varying ways for each particular application, but such implementation is not intended to exceed the scope of the present disclosure.

In the embodiments provided herein, it should be understood that the calibration device and method of Terahertz frequency band on-wafer S parameter may be implemented in other ways. For example, the embodiments of the calibration device of Terahertz frequency band on-wafer S parameter described above are merely illustrative, e.g., a division of the modules or elements into only one logical function, and there may be additional divisions in actual implementation. For example, multiple elements or components may be combined or integrated into another system, or some features may be omitted, or not performed. Alternatively, the couplings or direct couplings or communicative connections shown or discussed with respect to one another may be indirect couplings or communicative connections via some interface, devices or units, and may be electrical, mechanical or otherwise.

The units described as separate components may or may not be physically separate, and the components shown as units may or may not be physical units, i.e. may be located in one place, or may be distributed over a plurality of network elements. Some or all of the units may be selected to achieve the objectives of the solution of the present embodiment according to practical requirements.

In addition, the functional units in the embodiments may be integrated in one processing unit, may be physically separate from each other, or may be integrated in one unit by two or more units. The integrated units described above can be implemented either in the form of hardware or software functional units.

The integrated module/unit, if implemented in the form of a software functional unit and sold or used as a stand-alone product, may be stored in a computer-readable storage medium. Based on such an understanding, the present application may implement all or part of the processes of the above-described embodiments, and may also be implemented by a computer program instructing related hardware. The computer program as described may be stored in a computer-readable storage medium and performs the steps of the various method embodiments described above when executed by the processor. Therein, the computer program comprises computer program code, which may be in the form of source code, object code, executable files or some intermediate form, etc. The computer-readable medium may include: any entity or device capable of carrying the computer program code, recording media, U-disk, removable hard disk, magnetic disk, optical disk, computer memory, Read-Only Memory (ROM), Random Access Memory (RAM), electrical carrier wave signals, telecommunications signals, and software distribution media. It should be noted that the computer-readable medium may contain content that may be appropriately augmented or subtracted as required by legislation and patent practice within judicial jurisdictions, e.g., the computer-readable medium does not include electrical carrier wave signals and telecommunications signals in accordance with legislation and patent practices in some jurisdictions.

The above-described embodiments are merely illustrative of the technical solutions of the present disclosure and are not intended to be limiting thereof. Although the present disclosure has been described in detail with reference to the foregoing embodiments, those skilled in the art will appreciate that the technical solutions of the above-mentioned embodiments can still be modified, or some of the technical features thereof can be equivalently substituted; and such modifications and substitutions do not cause the nature of the corresponding technical solution to depart from the spirit and scope of the embodiments of the present disclosure, and are intended to be included within the scope of this application.

Although embodiments of the present disclosure have been described in detail, it should be understood that various changes, substitutions and alterations can be made herein without departing from the spirit and scope of the disclosure as defined by the appended claims.

Moreover, the scope of the present disclosure is not intended to be limited to the particular embodiments described here. As one of ordinary skill in the art will readily appreciate from the disclosure of the present disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

What is claimed is:

1. A calibration method of Terahertz frequency band on-wafer S parameter, comprising:
   acquiring eight error models obtained after a preliminary calibration of a Terahertz frequency band system;
   acquiring a first S parameter based on a first calibration piece on the basis of the eight error models, and determining a first mathematical model according to the first S parameter, the first mathematical model comprising parallel crosstalk terms between probes;
   acquiring a second S parameter based on a second calibration piece on the basis of the eight error models, and determining a second mathematical model according to the second S parameter, the second mathematical model comprising series crosstalk terms between the probes;
   acquiring a third S parameter based on a measured piece on the basis of the eight error models, and determining a third mathematical model according to the third S parameter, the third mathematical model comprising a Z parameter of the measured piece;
   obtaining the Z parameter of the measured piece based on the first mathematical model, the second mathematical model and the third mathematical model; and
   calibrating an S parameter of the measured piece according to the Z parameter of the measured piece; and
   wherein acquiring the first S parameter based on the first calibration piece on the basis of the eight error models, and determining the first mathematical model according to the first S parameter comprises:
      generating a first equivalent circuit model corresponding to the first calibration piece based on the first calibration piece;
      acquiring the first S parameter of the first calibration piece according to the eight error models;
      converting the first S parameter into a first Y parameter; and
      determining the first mathematical model according to the first Y parameter and the first equivalent circuit model, wherein the first mathematical model is represented as $Y_{Total}^{OPN}=Y_{PAD}+Y_P$, $Y_{Total}^{OPN}$ is the first Y parameter, $Y_{PAD}$ is a PAD (pad) parallel parasitic parameter, and $Y_p$ is the parallel crosstalk terms between the probes.

2. The calibration method according to claim 1, wherein the first calibration piece is an open-open calibration piece, and the second calibration piece is a short-short calibration piece.

3. The calibration method according to claim 1, wherein acquiring the second S parameter based on the second calibration piece on the basis of the eight error models, and determining the second mathematical model according to the second S parameter comprises:
   generating a second equivalent circuit model corresponding to the second calibration piece based on the second calibration piece;
   acquiring the second S parameter of the second calibration piece obtained by measurement according to the eight error models;
   converting the second S parameter into a second Y parameter; and
   determining the second mathematical model according to the second Y parameter and the second equivalent circuit model.

4. The calibration method according to claim 3, wherein the first calibration piece is an open-open calibration piece, and the second calibration piece is a short-short calibration piece.

5. The calibration method according to claim 3, wherein, the second mathematical model is represented as $Y_{Total}^{SHORT}=Y_{PAD}+Y_P+(Z_S+Z_L)^{-1}$, wherein $Y_{Total}^{SHORT}$ is the second Y parameter, $Y_{PAD}$ is the PAD parallel parasitic parameter, $Y_P$ is the parallel crosstalk terms between the probes, $Z_S$ is the series crosstalk terms between the probes, and $Z_L$ is a series parasitic parameter of a PAD intraconnection.

6. The calibration method according to claim 5, wherein the first calibration piece is an open-open calibration piece, and the second calibration piece is a short-short calibration piece.

7. The calibration method according to claim 1, wherein acquiring the third S parameter based on the measured piece on the basis of the eight error models, and determining the third mathematical model according to the third S parameter comprises:
   generating a third equivalent circuit model corresponding to the measured piece based on the measured piece;
   acquiring the third S parameter of the measured piece obtained by measurement according to the eight error models;
   converting the third S parameter into a third Y parameter; and
   determining the third mathematical model according to the third Y parameter and the third equivalent circuit model.

8. The calibration method according to claim 7, wherein the first calibration piece is an open-open calibration piece, and the second calibration piece is a short-short calibration piece.

9. The calibration method according to claim 7, wherein, the third mathematical model is represented as $Y_{Total}^{DUT}=Y_P+Y_{PAD}+S+Z_L+Z_{DUT})^{-1}$, wherein $Y_{Total}^{DUT}$ is the third Y parameter, $Y_P$ is the parallel crosstalk terms between the probes, $Y_{PAD}$ is the PAD parallel parasitic parameter, $Z_S$ is the series crosstalk terms between the probes, $Z_L$ is a series parasitic parameter of a PAD intraconnection, and $Z_{DUT}$ is the Z parameter of the measured piece.

10. The calibration method according to claim 9, wherein the first calibration piece is an open-open calibration piece, and the second calibration piece is a short-short calibration piece.

11. The calibration method according to claim 1, wherein the first calibration piece is an open-open calibration piece, and the second calibration piece is a short-short calibration piece.

12. A terminal equipment comprising a non-transitory memory, a processor and a computer program stored in the memory and executable on the processor, wherein the processor, when executing the computer program, causes the terminal equipment to perform:
  acquiring eight error models obtained after a preliminary calibration of a Terahertz frequency band system;
  acquiring a first S parameter based on a first calibration piece on the basis of the eight error models, and determining a first mathematical model according to the first S parameter, the first mathematical model comprising parallel crosstalk terms between probes;
  acquiring a second S parameter based on a second calibration piece on the basis of the eight error models, and determining a second mathematical model according to the second S parameter, the second mathematical model comprising series crosstalk terms between the probes;
  acquiring a third S parameter based on a measured piece on the basis of the eight error models, and determining a third mathematical model according to the third S parameter, the third mathematical model comprising a Z parameter of the measured piece;
  obtaining the Z parameter of the measured piece based on the first mathematical model, the second mathematical model and the third mathematical model, and
  calibrating an S parameter of the measured piece according to the Z parameter of the measured piece; and
  wherein acquiring the first S parameter based on the first calibration piece on the basis of the eight error models, and determining the first mathematical model according to the first S parameter comprises:
    generating a first equivalent circuit model corresponding to the first calibration piece based on the first calibration piece;
    acquiring the first S parameter of the first calibration piece according to the eight error models;
    converting the first S parameter into a first Y parameter; and
    determining the first mathematical model according to the first Y parameter and the first equivalent circuit model, wherein the first mathematical model is represented as $Y_{Total}^{OPN} = Y_{PAD} + Y_p$, $Y_{Total}^{OPN}$ is the first Y parameter, $Y_{PAD}$ is a PAD (pad) parallel parasitic parameter, and $Y_p$ is the parallel crosstalk terms between the probes.

13. A non-transitory computer-readable storage medium storing a computer program that, when executed by one or more processors, causes the one or more processors to perform:
  acquiring eight error models obtained after a preliminary calibration of a Terahertz frequency band system;
  acquiring a first S parameter based on a first calibration piece on the basis of the eight error models, and determining a first mathematical model according to the first S parameter, the first mathematical model comprising parallel crosstalk terms between probes;
  acquiring a second S parameter based on a second calibration piece on the basis of the eight error models, and determining a second mathematical model according to the second S parameter, the second mathematical model comprising series crosstalk terms between the probes;
  acquiring a third S parameter based on a measured piece on the basis of the eight error models, and determining a third mathematical model according to the third S parameter, the third mathematical model comprising a Z parameter of the measured piece;
  obtaining the Z parameter of the measured piece based on the first mathematical model, the second mathematical model and the third mathematical model, and
  calibrating an S parameter of the measured piece according to the Z parameter of the measured piece; and
  wherein acquiring the first S parameter based on the first calibration piece on the basis of the eight error models, and determining the first mathematical model according to the first S parameter comprises:
    generating a first equivalent circuit model corresponding to the first calibration piece based on the first calibration piece;
    acquiring the first S parameter of the first calibration piece according to the eight error models;
    converting the first S parameter into a first Y parameter; and
    determining the first mathematical model according to the first Y parameter and the first equivalent circuit model, wherein the first mathematical model is represented as $Y_{Total}^{OPN} = Y_{PAD} + Y_p$, $Y_{Total}^{OPN}$ is the first Y parameter, $Y_{PAD}$ is a PAD (pad) parallel parasitic parameter, and $Y_p$ is the parallel crosstalk terms between the probes.

* * * * *